(12) United States Patent
Liu et al.

(10) Patent No.: US 7,952,919 B2
(45) Date of Patent: May 31, 2011

(54) PHASE CHANGE MEMORY STRUCTURE WITH MULTIPLE RESISTANCE STATES AND METHODS OF PROGRAMMING AND SENSING SAME

(75) Inventors: Jun Liu, Boise, ID (US); Mike Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/949,844

(22) Filed: Nov. 19, 2010

(65) Prior Publication Data

US 2011/0062409 A1    Mar. 17, 2011

Related U.S. Application Data

(62) Division of application No. 11/806,515, filed on May 31, 2007, now Pat. No. 7,859,893.

(51) Int. Cl.
*G11C 11/00* (2006.01)

(52) U.S. Cl. .................. 365/163; 365/148; 977/754

(58) Field of Classification Search ............ 365/46, 365/63–72, 100, 148, 163; 257/2–5; 438/95, 438/96, 166, 365, 482, 486, 597
See application file for complete search history.

(56) References Cited

U.S. PATENT DOCUMENTS

| | | | |
|---|---|---|---|
| 5,982,659 A | 11/1999 | Irrinki et al. | |
| 6,072,716 A | 6/2000 | Jacobson et al. | |
| 6,141,241 A * | 10/2000 | Ovshinsky et al. | 365/163 |
| 6,418,049 B1 * | 7/2002 | Kozicki et al. | 365/174 |
| 6,881,623 B2 | 4/2005 | Campbell et al. | |
| 6,888,155 B2 | 5/2005 | Campbell | |
| 2003/0137869 A1 | 7/2003 | Kozicki | |
| 2006/0077706 A1 * | 4/2006 | Li et al. | 365/163 |
| 2006/0097239 A1 | 5/2006 | Hsiung | |
| 2007/0008768 A1 * | 1/2007 | Daley | 365/148 |

FOREIGN PATENT DOCUMENTS

| | | |
|---|---|---|
| EP | 1 249 841 A1 | 10/2002 |
| EP | 1 416 497 A2 | 5/2004 |

OTHER PUBLICATIONS

"Nitrogen-implanted Ge2Sb2Te5 film used as multilevel storage media for phase change random access memory," to Bo Liu et al., Institute of Physics Publishing Semiconductor Science and Technology No. 19, Apr. 24, 2004, L61-L64.

Matsuzaki, N. et al., "Oxygen-Doped GeSbTe Phase-Change Memory Cells Featuring 1.5—V/100-μA Standard 0.13-μm CMOS Operations", Electron Devices Meeting, Dec. 5, 2005, IEEE.

(Continued)

*Primary Examiner* — Richard Elms
*Assistant Examiner* — Harry W Byrne
(74) *Attorney, Agent, or Firm* — Dickstein Shapiro LLP

(57) ABSTRACT

A phase change memory structure with multiple resistance states and methods of forming, programming, and sensing the same. The memory structure includes two or more phrase change elements provided between electrodes. Each phase change element has a respective resistance curve as a function of programming voltage which is shifted relative to the resistance curves of other phase change elements. In one example structure using two phase change elements, the memory structure is capable of switching among four resistance states.

18 Claims, 14 Drawing Sheets

OTHER PUBLICATIONS

Kim, S. M. et al., "Electrical Properties and Crystal Structures of Nitrogen-Doped $Ge_2Sb_2Te_5$ Thin Film for Phase Change Memory", Thin Solid Films, vol. 469-470, Dec. 22, 2004, pp. 322-326.

Y. Lai, et al.; "Stacked Chalcogenide Layers Used As Multi-State Storage Medium for Phase Change Memory"; Applied Physics A 84,; 21-25 (2006).

* cited by examiner

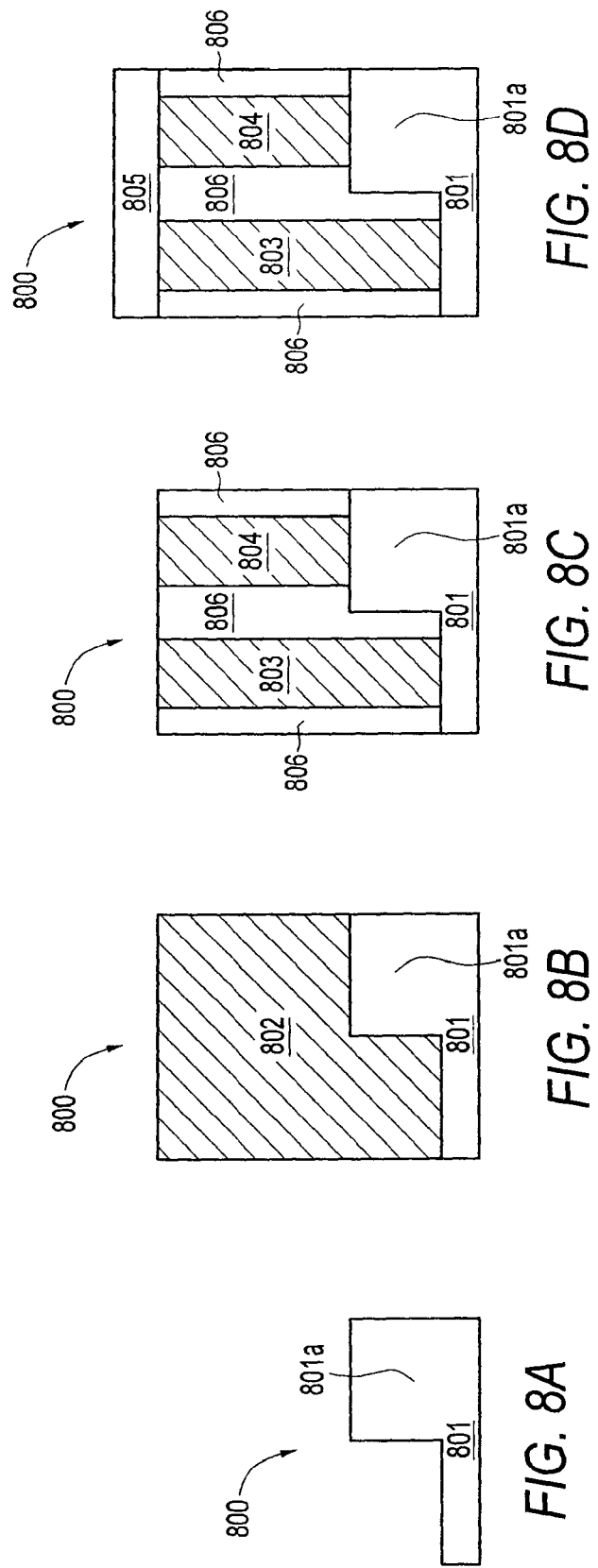

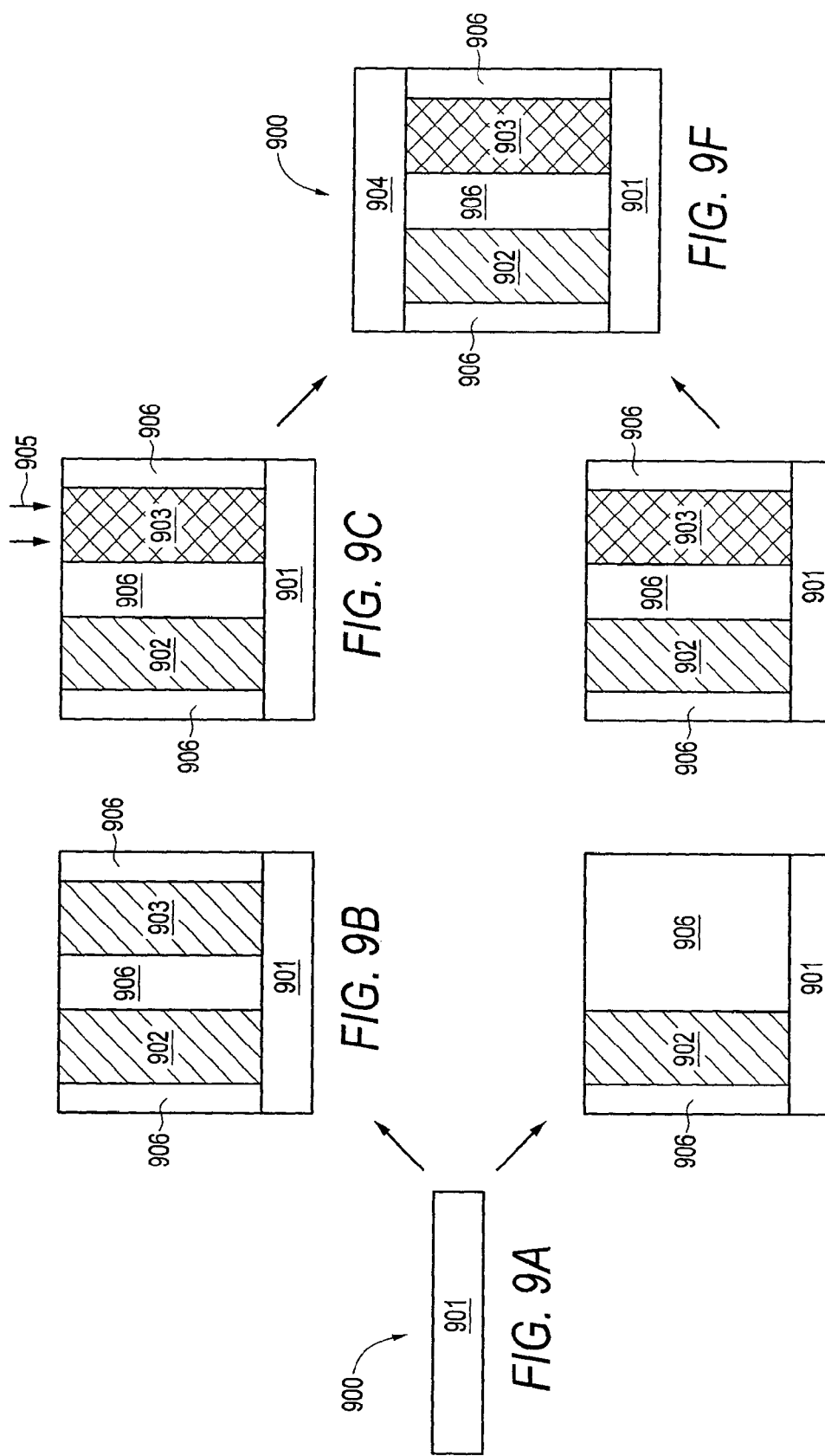

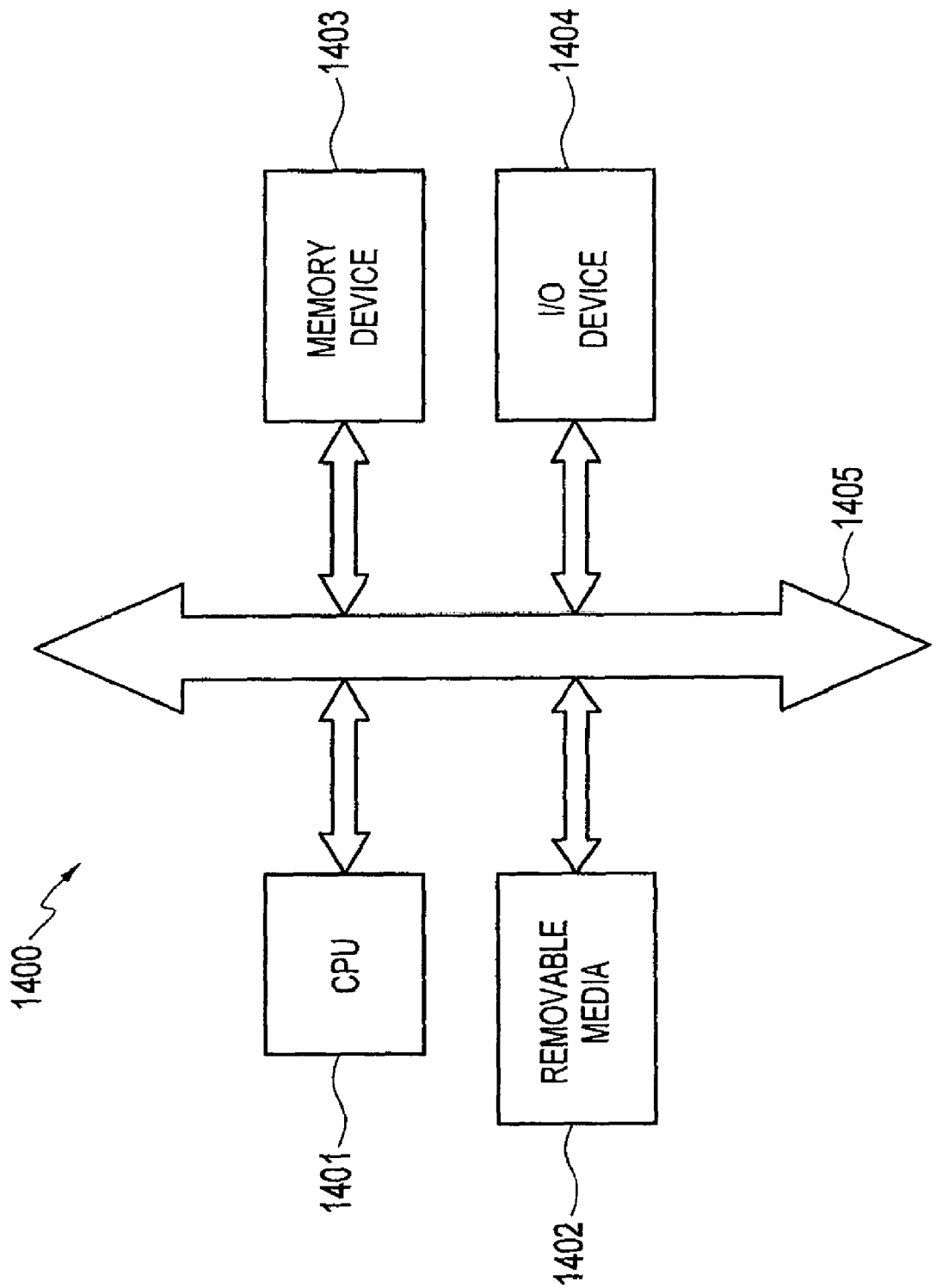

PHASE CHANGE MEMORY STRUCTURE WITH MULTIPLE RESISTANCE STATES AND METHODS OF PROGRAMMING AND SENSING SAME

CROSS-REFERENCE TO RELATED APPLICATION

This application is a divisional of application Ser. No. 11/806,515, filed May 31, 2007 now U.S. Pat. No. 7,859,893, the entirety of which is incorporated herein by reference.

FIELD OF THE INVENTION

The embodiments of the invention relate generally to the field of semiconductor devices and, more particularly, to resistive memory devices, e.g., phase change memory devices, having multiple level resistance states.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. Traditionally, however, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Research and development of commercially viable memory devices that are randomly accessed, have relatively low power consumption, and are non-volatile is ongoing. One ongoing area of research is in resistive memory cells where resistance states can be programmably changed. One avenue of research relates to devices that store data in memory cells by structurally or chemically changing a physical property of the memory cells in response to applied programming voltages, which in turn change cell resistance. Examples of variable resistance memory devices being investigated include memories using variable resistance polymers, perovskite, doped amorphous silicon, phase-changing glasses, and doped chalcogenide glass, among others.

FIG. 1 shows a basic composition of a variable resistance memory cell such as a phase change memory cell 1 constructed over a substrate 2, having a variable resistance material 4 formed between a bottom electrode 3 and a top electrode 5. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), LaSrMnO$_3$ (LSMO), GdBaCo$_x$O$_y$ (GBCO) as disclosed in U.S. Pat. No. 6,473,332 to Ignatiev et al. Still another type of variable resistance material may be a doped chalcogenide glass of the formula $A_xB_y$, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Pat. Nos. 6,881,623 and 6,888,155 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the illustrated electrodes 3, 5 can be selected from a variety of conductive materials, such as tungsten, nickel, tantalum, titanium, titanium nitride, aluminum, platinum, or silver, among others.

Much research has focused on memory devices using memory elements composed of phase changing chalcogenides as the resistance variable material. Chalcogenides are alloys of Group VI elements of the periodic table, such as Te or Se. A specific chalcogenide currently used in rewriteable compact discs ("CD-RW") is $Ge_2Sb_2Te_5$. In addition to having valuable optical properties that are utilized in CD-RW discs, $Ge_2Sb_2Te_5$ also has desirable physical properties as a variable resistance material. Various combinations of Ge, Sb and Te may be used as variable resistance materials and which are herein collectively referred to as "GST" materials. Specifically, GST materials can change structural phases between an amorphous phase and two crystalline phases. The resistance of the amorphous phase ("a-GST") and the resistances of cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material.

The transition from one GST phase to another occurs in response to temperature changes of the GST material. The temperature changes, i.e., heating and cooling, can be caused by passing differing strengths of current through the GST material. The GST material is placed in a crystalline state by passing a crystallizing current through the GST material, thus warming the GST material to a temperature wherein a crystalline structure may grow. A stronger melting current is used to melt the GST material for subsequent cooling to an amorphous state. As the typical phase change memory cell uses the crystalline state to represent a binary 1 and the amorphous state to represent a binary 0, the crystallizing current is referred to as a write or set current $I_{SET}$ and the melting current is referred to as an erase or reset current $I_{RST}$. One skilled in the art will understand, however, that the assignment of GST states to binary values may be switched if desired.

Phase change memory cells known in the prior art typically have two stable resistance states, corresponding to the binary 0 and 1. Thus, a conventional two-state phase change memory cell can store one bit of information. Phase change memory cells with more than two stable resistance states are desirable because they would allow each cell to store more than one bit of information, thereby increasing memory storage capacity without significantly increasing storage device size or power consumption.

Researchers in China have proposed one such multi-state phase change memory cell using stacked calcogenide films as storage media. See Y. Lai, et al., *Stacked chalcogenide layers used as multi-stage storage medium for phase change memory*, Appl. Phys. A 84, 21-25 (2006). As shown in FIG. 2A, the proposed multi-state phase change memory cell 200 comprises a bottom electrode 201, a pure GST layer 202, a tungsten layer 203, a silicon-doped GST layer 204, and a top electrode 205. This proposed phase change memory cell 200 provides three relatively stable resistance states (1), (2), and (3), as illustrated by FIG. 2B. Implementing three-state logic with cell 200 is difficult. There is a need for a multiple bit phase change memory cell which is easily implemented and which provides more than three stable resistance states.

BRIEF DESCRIPTION OF THE DRAWINGS

FIGS. 8A-8D are cross-sectional views of a phase change memory cell configured as a vertical cell with elements of different lengths in accordance with an embodiment disclosed herein at four stages of formation.

FIGS. 9A-9F are cross-sectional views of a phase change memory cell configured as a vertical cell with elements of different resistivities in accordance with an embodiment disclosed herein at various stages of formation.

FIG. 14 illustrates a processor system that includes a memory device according to an embodiment disclosed herein.

DETAILED DESCRIPTION OF THE INVENTION

Figure 1:
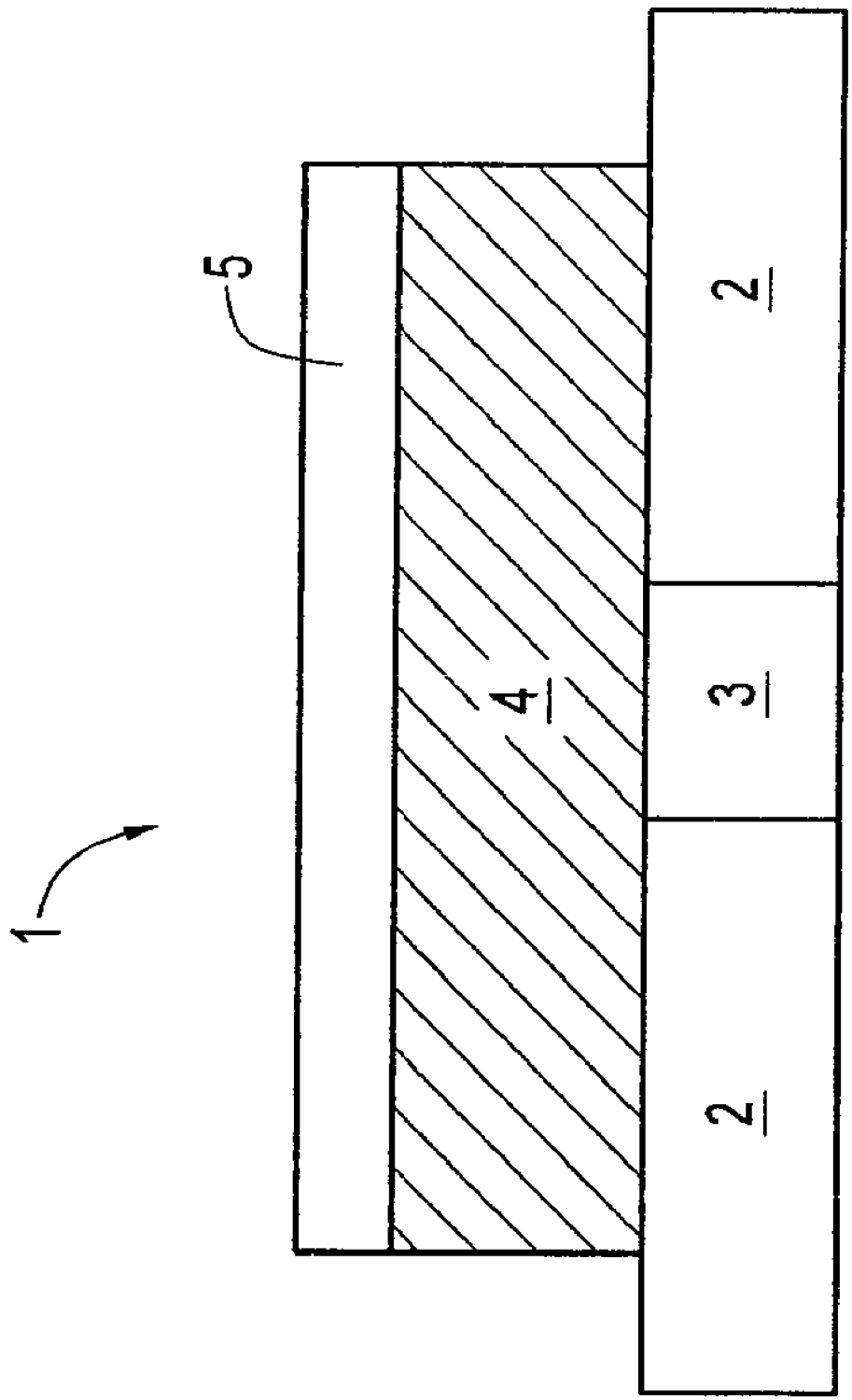
FIG. 1 is a cross-sectional view of a two-state phase change memory cell in accordance with the prior art.
Figure 2B:
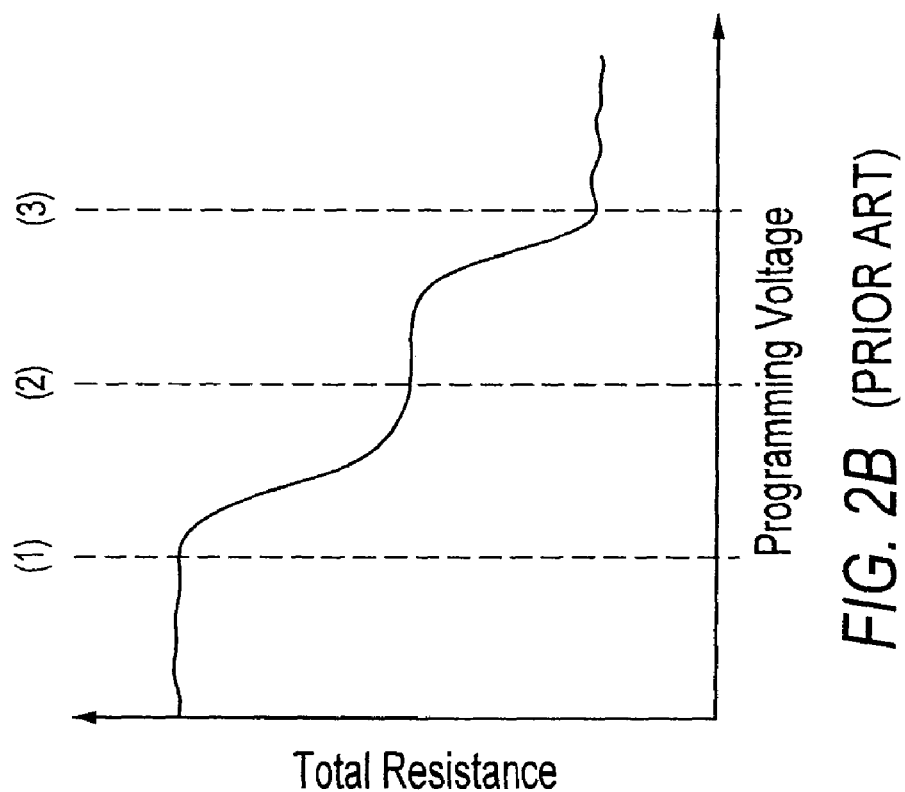
FIG. 2B is a graph of the total resistance of the phase change memory cell of FIG. 2A in response to differing program voltages.
Figure 2A:
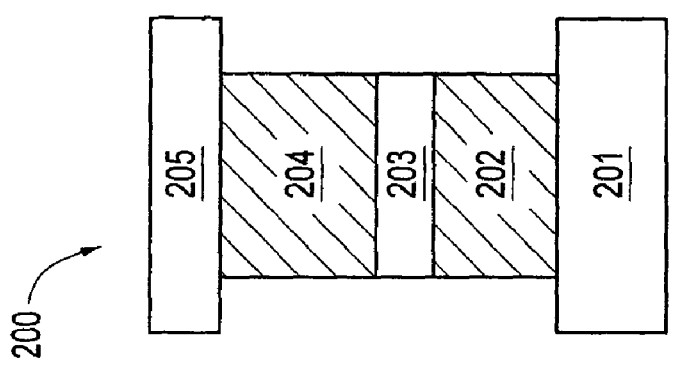
FIG. 2A is a cross-sectional view of a three-state phase change memory cell in accordance with the prior part.

In the following detailed description, reference is made to the accompanying drawings, which form a part hereof and show by way of illustration specific embodiments in which the claimed invention may be practiced. These embodiments are described in sufficient detail to enable those skilled in the art to practice them, and it is to be understood that other embodiments may be utilized. The progression of processing steps described is exemplary of embodiments of the invention. However, the sequence of steps is not limited to that set forth herein and may be changed as is known in the art, with the exception of steps necessarily occurring in a certain order.

In one embodiment, two fully-switched phase change material elements are fabricated sharing the same first and second electrodes. The elements are designed such that their respective resistance curves as a function of programming voltage are shifted with respect to each other, as shown in FIG. 3A. The shifted resistance curves can be achieved by fabricating the elements with different phase change materials or by adjusting one or more element properties, such as, for example, length, resistivity, cross-sectional area, crystallization temperature, and melting point, as described in greater detail below.

Still referring to FIG. 3A, the curve labeled R(a) corresponds to one of the two phase change elements, while the curve labeled R(b) corresponds to the other of the two phase change elements. The suffix "a" or "c" following R(a) and R(b) indicate whether the respective phase change element is in an amorphous or crystalline state. For example, the label "R(a)a" indicates the phase change element R(a) is in an amorphous state. By applying different programming voltages, four stable resistance states labeled (1), (2), (3), and (4) can be achieved. In state (1), both elements are in low resistance configurations, R(a)c and R(b)c. In state (2), element R(a) is in a high resistance configuration, R(a)a, while element R(b) is in a low resistance configuration, R(b)c. In state (3), element R(a) is in a low resistance configuration, R(a)c, while element R(b) is in a high resistance configuration, R(b)c. In state (4), both elements are in high resistance configurations, R(a)a and R(b)a.

Figure 3B:
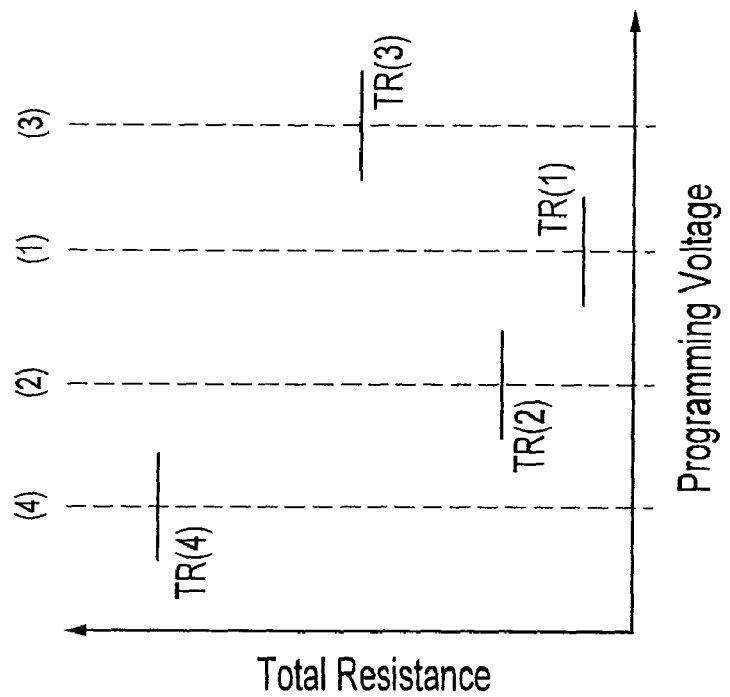
FIG. 3B is a graph of four stable resistance states of a phase change memory cell constructed in accordance with an embodiment disclosed herein.
Figure 3A:
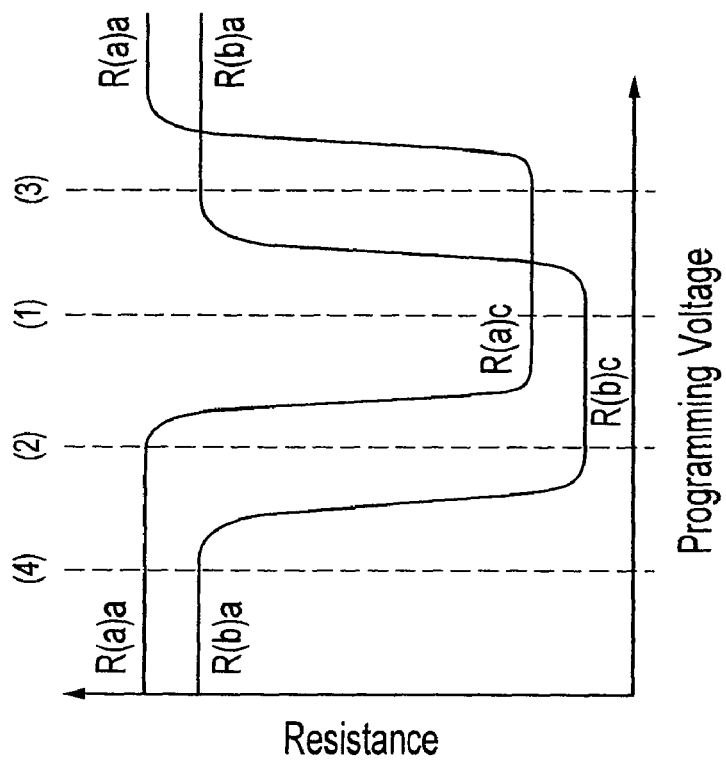
FIG. 3A is a graph of the resistance of each element of a phase change memory cell constructed in accordance with an embodiment disclosed herein in response to differing program voltages.

FIG. 3B is a graph of the combined resistance of the elements R(a) and R(b) plotted in FIG. 3A, i.e. the total resistance of the phase change memory cell. Because the phase change memory cell achieves four stable resistance states, it is able to store two bits of information, i.e. $2^2$ or four discrete values corresponding to its four stable resistance states. Total resistance level TR(1) corresponds to state (1). Total resistance level TR(2) corresponds to state (2), and so on.

Figure 4:
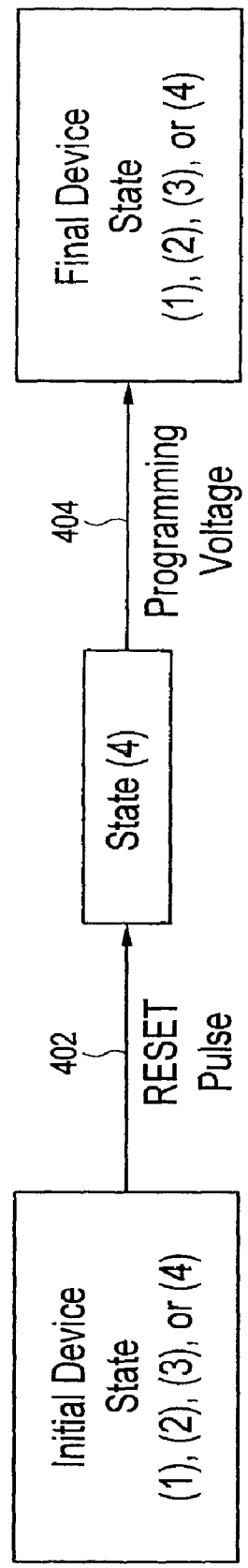
FIG. 4 is a flowchart illustrating a method of programming a phase change memory cell constructed in accordance with an embodiment disclosed herein.

FIG. 4 illustrates the steps of a method of programming a multi-state phase change memory cell, such as the four-state cell just described, and the final device states. Programming begins with a RESET pulse 402 to return elements R(a) and R(b) to an initial amorphous state, i.e. state (4) in which both elements are in a high resistance configuration. A programming voltage 404 is then applied to program the memory cell to one of the four states (1), (2), (3), and (4). The voltage of the programming pulse is a function of the value to be stored in the memory cell, as shown in FIG. 3B.

Figure 5B:
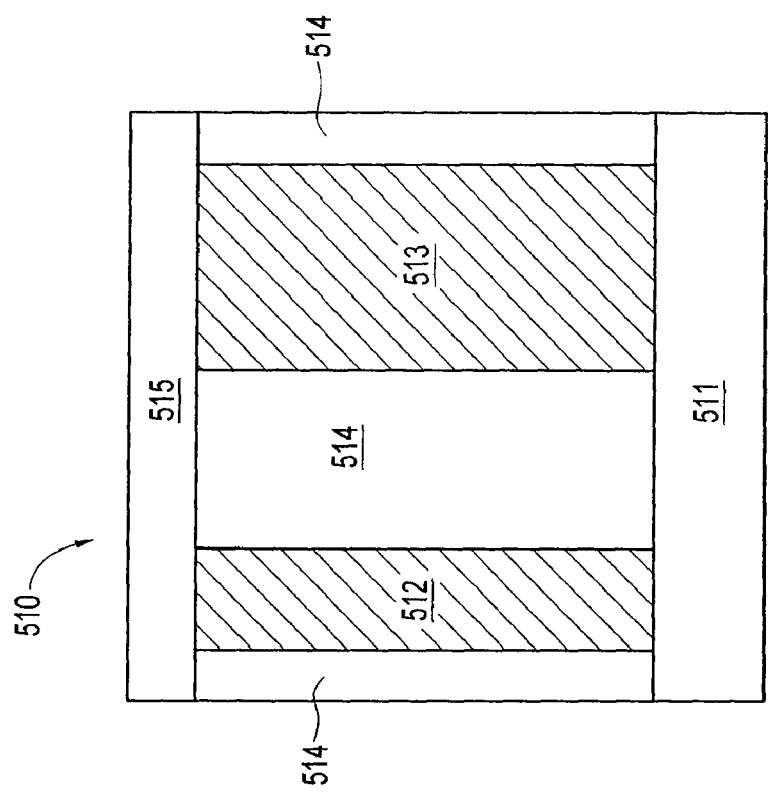
FIG. 5B is a cross-sectional view of a phase change memory cell having two elements of different cross-sectional areas in accordance with an embodiment disclosed herein.
Figure 5A:
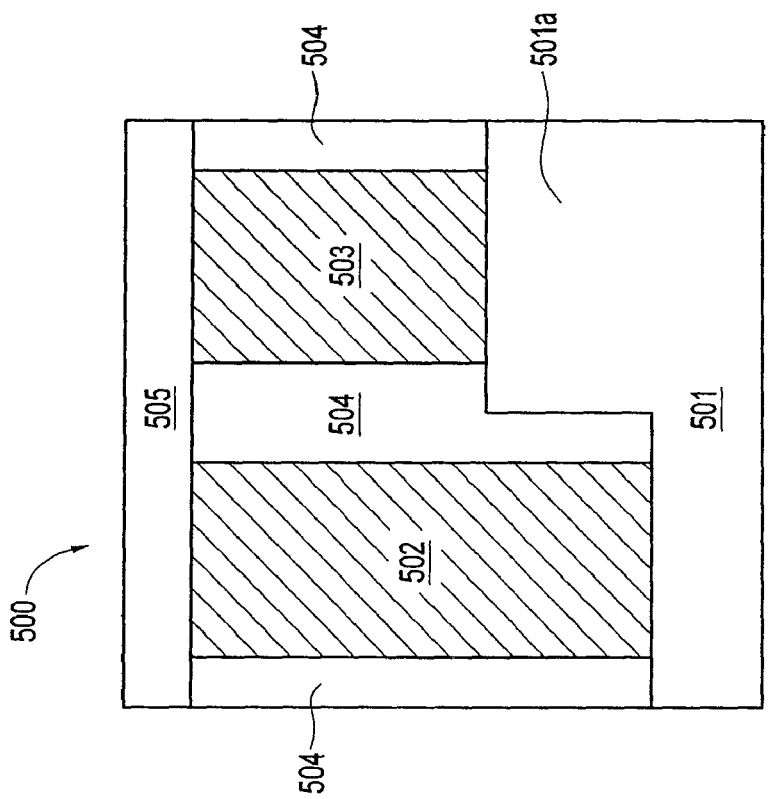
FIG. 5A is a cross-sectional view of a phase change memory cell having two elements of different lengths in accordance with an embodiment disclosed herein.

FIG. 5A depicts a phase change memory cell 500 constructed in accordance with a disclosed embodiment. The cell 500 comprises a first electrode 501, a first phase change element 502, a second phase change element 503, and a second electrode 505. The phase change elements 502, 503, comprising any suitable variable resistance material, such as, for example, $Ge_2Sb_2Te_5$, are each in contact with both of the electrodes 501, 505. To achieve different respective resistances, the phase change elements 502, 503 are formed with different lengths. The first element 502 is depicted as being longer than the second element 503, although the reverse is also possible. An elongated portion 501a of first electrode 501 is used to shorten the distance between the first electrode 501 and the second electrode 505 in the portion of the memory cell 500 containing the second phase change element 503, thereby permitting the second phase change element 503 to be shorter than the first phase change element 502. Alternatively, the first electrode 501 could be substantially planar while the second electrode 505 contains a lowered portion to make contact with the shorter phase change element 503. A dielectric material 514, such as, for example, $SiO_2$, surrounds the phase change elements 502, 503.

FIG. 5B depicts a phase change memory cell 510 constructed in accordance with another disclosed embodiment. The cell 510 comprises a first electrode 511, a first phase change element 512, a second phase change element 513, and a second electrode 515. The elements 512, 513 are each in contact with both electrodes 511, 515. Elements 512, 513 have similar resistivity and height but element 513 has a lower melting point and a wider cross-sectional area than element 512. Thus, the programming voltage and resistance of element 513 is reduced. Because first phase change element 512 and second phase change element 513 have a substantially similar length, the raised portion 501a of first electrode 501 shown in FIG. 5A is not required, thereby simplifying electrode formation in this embodiment. In an alternative embodiment, element 513 has the same melting point, cross-sectional area, and height as element 512 but a lower resistivity, thereby achieving a similarly shifted programming voltage. In yet another alternative embodiment, element 513 has the same cross-sectional area and height as element 512 but a lower resistivity and melting point, thereby achieving a similarly shifted programming voltage. A dielectric material 514 surrounds the phase change elements 512, 513.

Figure 6C:
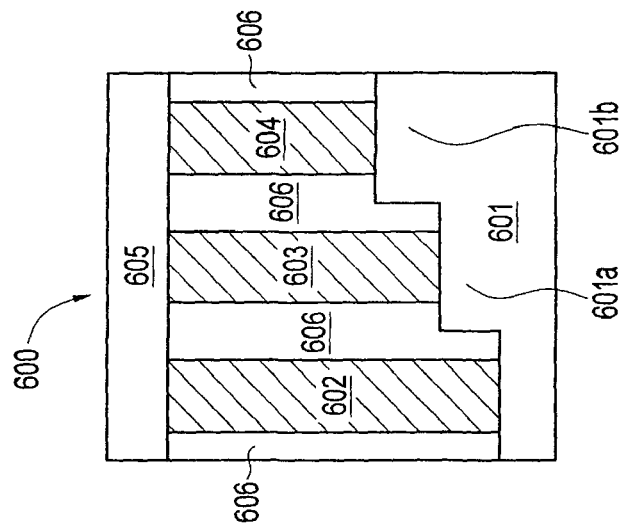
FIG. 6C is a cross-sectional view of a phase change memory cell having three elements of different lengths in accordance with an embodiment disclosed herein.

Although FIGS. 5A and 5B depict four-state phase change memory cells constructed in accordance with disclosed embodiments, the claimed invention is not so limited and can be expanded to provide an arbitrary number of stable resistance states. FIG. 6A shows the resistance curves for three phase change elements in a six-state phase change memory cell, e.g. cell 600 of FIG. 6C, constructed in accordance with a disclosed embodiment. The elements are designed such that their respective resistance curves as a function of programming voltage are shifted with respect to each other. The shifted resistance curves can be achieved by fabricating the elements with different phase change materials or by adjusting one or more element properties, such as, for example, length, resistivity, cross-sectional area, crystallization temperature, and melting point, as described in greater detail below.

Still referring to FIG. 6A, the curve labeled R(a) corresponds to a first phase change element, the curve labeled R(b) corresponds to a second phase change element, and the curve labeled R(c) corresponds to a third phase change element. The suffix "a" or "c" following R(a), R(b), and R(c) indicate whether the respective phase change element is in an amorphous or crystalline state. For example, the label "R(b)c" indicates the phase change element R(b) is in an crystalline state. By applying different programming voltages, six stable resistance states labeled (1), (2), (3), (4), (5), and (6) can be achieved. In state (1), all three elements are in a low resistance, i.e. crystalline, configuration. In state (2), the first element is in a high resistance configuration while the second and third elements are in a low resistance configuration. In state (3), the first and second elements are in a high resistance configuration while the third element is in a low resistance configuration. In state (4), the first and second elements are in a low resistance configuration while the third element is in a high resistance configuration. In state (5), the first element is in a low resistance configuration while the second and third elements are in a high resistance configuration. In state (6), all three elements are in a high resistance, i.e. amorphous, configuration.

Figure 6B:
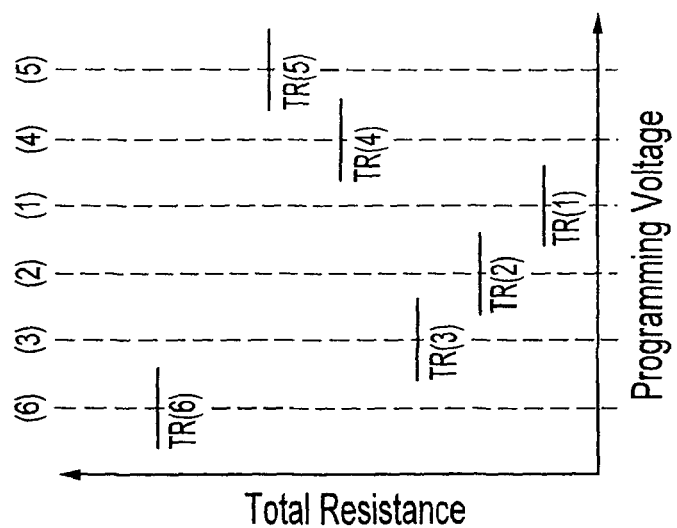
FIG. 6B is a graph of six stable resistance states of a phase change memory cell constructed in accordance with an embodiment disclosed herein.
Figure 6A:
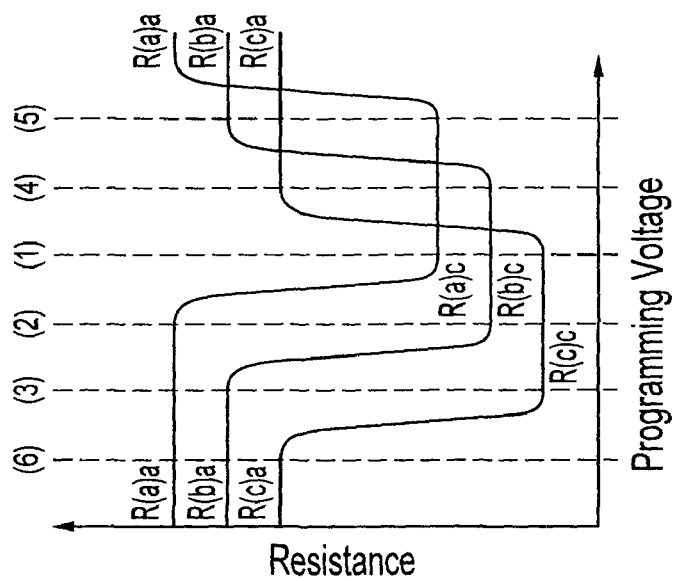
FIG. 6A is a graph of the resistance of each element of a phase change memory cell constructed in accordance with an embodiment disclosed herein in response to differing program voltages.

FIG. 6B is a graph of the combined resistance of the elements R(a), R(b), and R(c) plotted in FIG. 6A, i.e. the total resistance of the phase change memory cell. Because the phase change memory cell achieves six stable resistance states, it is able to store six discrete values. Total resistance level TR(1) corresponds to state (1). Total resistance level TR(2) corresponds to state (2), and so on.

FIG. 6C shows one possible structure of a six-state phase change memory cell 600. The cell 600 comprises a first electrode 601 with elongated portions 601a, 601b, a first phase change element 602, a second phase change element 603, a third phase change element 604, and a second electrode 605. The structure is similar to that of the four-state phase change memory cell depicted in FIG. 5A and described above, but adds the third element 604 and a second elongated portion 601b of first electrode 601. Each of the three phase change elements 602, 603, 604 has a different respective length, causing each to have a different resistance. Different resistances can also be achieved through other means, such as, for example, varying the cross-sectional area of each phase change element, as described above with reference to FIG. 5B. A dielectric material 606 surrounds the phase change elements 602, 603, 604.

Figure 7C:
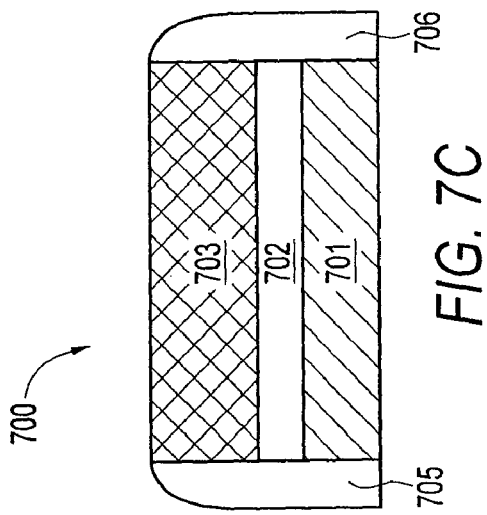
FIGS. 7A-7C are cross-sectional views of a phase change memory cell configured as a stack cell in accordance with an embodiment disclosed herein at three stages of formation.
Figure 7B:
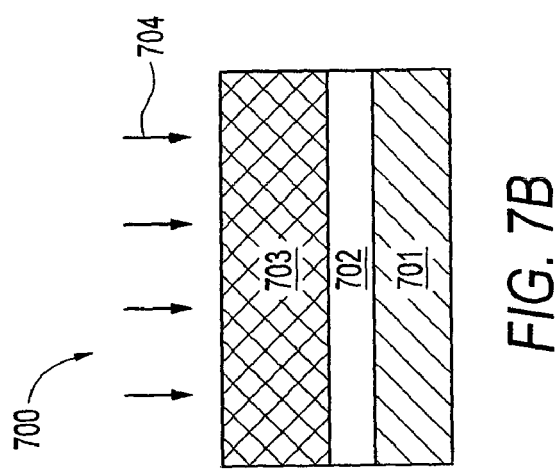
Figure 7A:
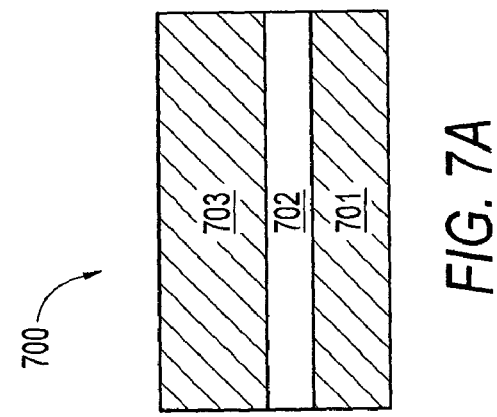

Phase change memory cells in accordance with embodiments disclosed herein can be constructed as stack cells. FIGS. 7A-7C illustrate a method that can be used to form a four-state phase change memory cell as a stack cell. As shown in FIG. 7A, memory cell stack 700 is formed comprising a first layer of phase change material 701, for example $Ge_2Sb_2Te_5$, a dielectric layer 702, for example $SiO_2$, and a second layer of phase change material 703. The resistivity of the second phase change material 703 is altered by doping 704, for example with an O or N dopant, as shown in FIG. 7B. Conductive sidewalls 705, 706 serve as electrodes and are formed on either side of the gate stack 700, as shown in FIG. 7C.

Phase change memory cells in accordance with embodiments disclosed herein can also be constructed as vertical cells. FIGS. 8A-8D illustrate a method that can be used to form a four-state phase change memory cell as a vertical cell. As shown in FIG. 8A, a bottom electrode 801 is formed with an elevated portion 801a, as described above with reference to FIG. 5A. A layer of phase change material 802 is deposited over the bottom electrode 801, as shown in FIG. 8B. The phase change material 802 is etched to form two phase change material elements 803, 804, as shown in FIG. 8C. A dielectric material 806 is formed surrounding the phase change elements 803, 804. A top electrode 805 is then formed over and in contact with the two phase change elements 803, 804 and the dielectric material 806, as shown in FIG. 8D.

In an another vertical cell embodiment, a phase change memory cell constructed in accordance herewith comprises phase change elements of the same length but different phase change material compositions. FIGS. 9A-9F illustrate two alternative methods of forming such a phase change memory cell. As shown in FIG. 9A, a bottom electrode 901 is formed. According to one embodiment, two phase change elements 902, 903 of the same phase change material are then formed over and in contact with the bottom electrode 901, as shown in FIG. 9B. A dielectric material is formed surrounding the phase change elements 902, 903. Alternatively, the dielectric material could be formed first, then etched to form channels in which the phase change elements 902, 903 are formed. To achieve different resistances, one of the elements 903 is subjected to doping 905, for example O or N doping, while the other element 902 remains pure, as shown in FIG. 9C.

Referring to FIG. 9D, in an alternative embodiment, one phase change element 902 is formed of a first phase change material. A dielectric material 906 is formed around the phase change element 902. Alternatively, the dielectric material could be formed first and etched to form a channel in which the phase change element 902 is formed. A second phase change element 903 of a second phase change material having a different resistivity than the first phase change material 902 is formed in a channel etched in the dielectric material 906 and over and in contact with the bottom electrode 901, as shown in FIG. 9E. According to either embodiment, a top electrode 904 is formed over and in contact with the phase change elements 902, 903, as shown in FIG. 9F.

Figure 10C:
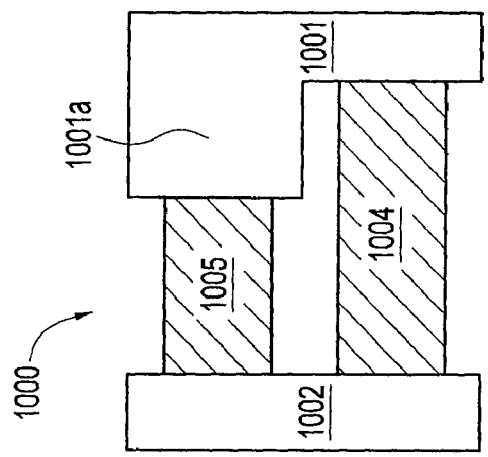
FIGS. 10A-10C are top-down views of a phase change memory cell configured as a planar cell with elements of different lengths in accordance with an embodiment disclosed herein at three stages of formation.
Figure 10B:
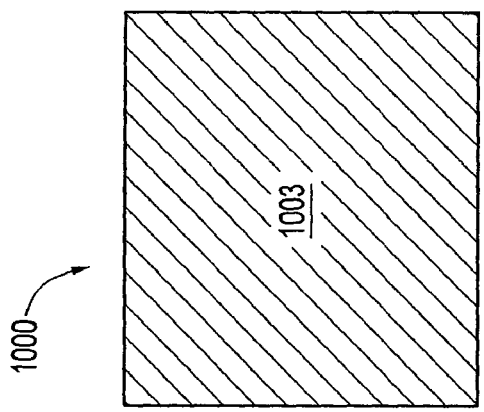
Figure 10A:
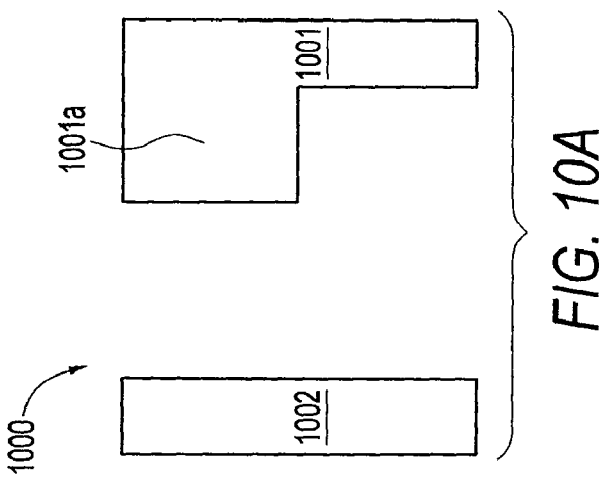

Phase change memory cells in accordance with embodiments disclosed herein can be constructed as planar cells. FIGS. 10A-C are top-down views illustrating a method of forming a four-state phase change memory cell as a planar cell. As shown in FIG. 10A, first and second electrodes 1001, 1002 are formed on a substrate (not shown). The first electrode 1001 includes an extended portion 1001a to accommodate phase change material elements of differing length, as described previously. A phase change material 1003 is deposited over the electrodes, as shown in FIG. 10B. The phase change material is then patterned to form two phase change material elements 1004, 1005, both in contact with the first and second electrodes 1001 and 1002, as shown in FIG. 10C. A dielectric (not shown) is formed surrounding the phase change elements 1004, 1005.

Figure 11C:
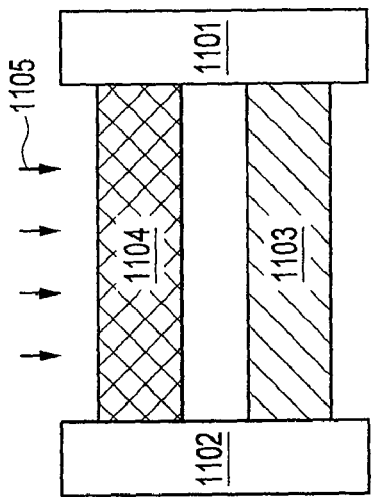
FIGS. 11A-11E are top-down views of a phase change memory cell configured as a planar cell with elements of different resistivities in accordance with an embodiment disclosed herein at various stages of formation.
Figure 11E:
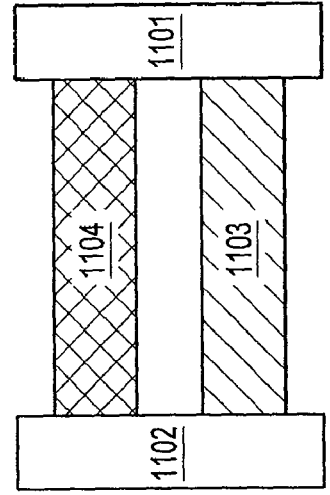
Figure 11B:
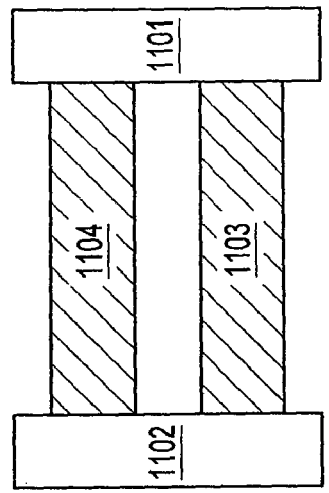
Figure 11D:
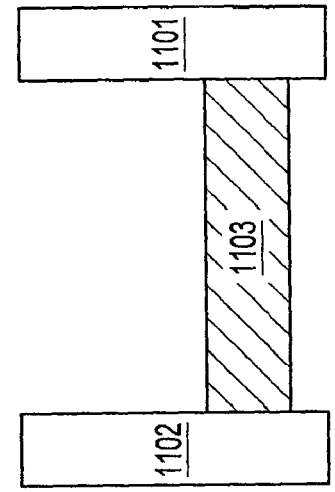
Figure 11A:
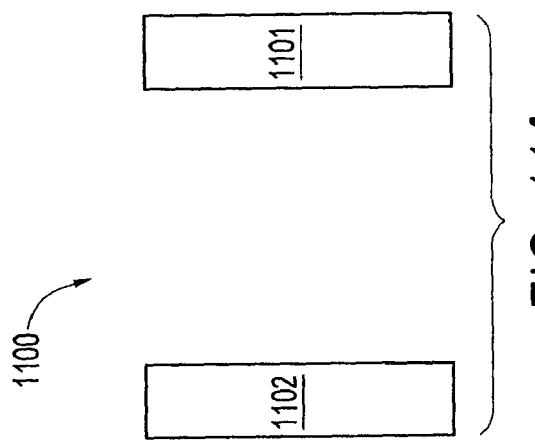

In an another planar cell embodiment, a phase change memory cell constructed in accordance herewith comprises phase change elements of the same length but different phase change material compositions. FIGS. 11A-E are top-down views illustrating two alternative methods of forming such a phase change memory cell. As shown in FIG. 11A, first and second electrodes 1101, 1102 are formed. According to one embodiment, a phase change material is deposited over the electrodes, then patterned to form two phase change elements 1103, 1104, as shown in FIG. 11B. To achieve different resistances, one of the elements 1104 is subjected to doping 1105, for example O or N doping, while the other element 1103 remains pure, as shown in FIG. 11C. In an alternative embodiment, one phase change element 1103 is formed of a first phase change material, as shown in FIG. 11D. A second phase change element 1104 of a second phase change material having a different resistivity than the first phase change material is formed between and in contact with electrodes 1101 and 1102, as shown in FIG. 11E. A dielectric (not shown) is formed surrounding phase change elements 1103, 1104.

Figure 12:
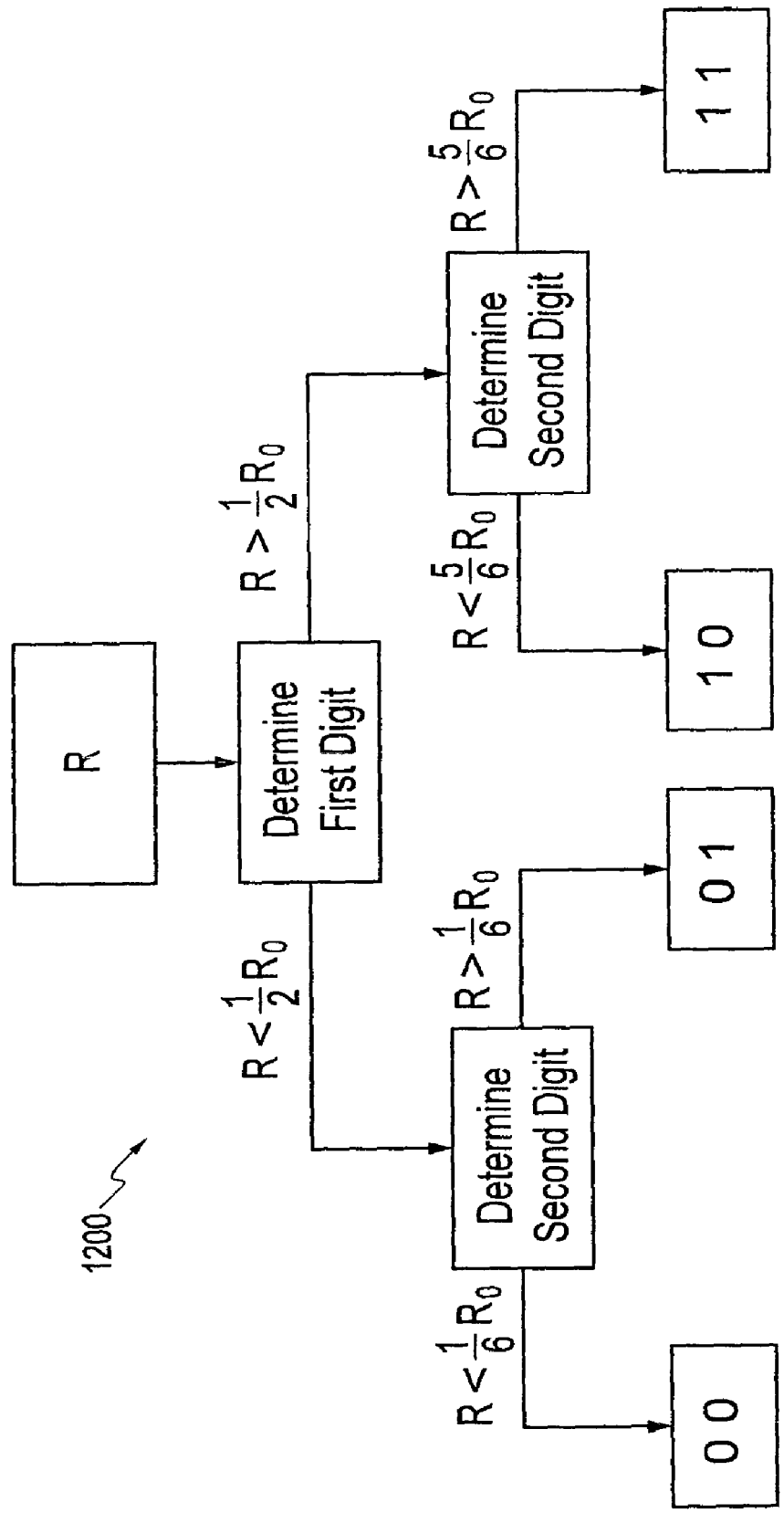
FIG. 12 depicts a four-state, voltage-sensing sense amplifier, which could be used in conjunction with the multi-state phase change memory cell embodiments disclosed herein.
Figure 13:
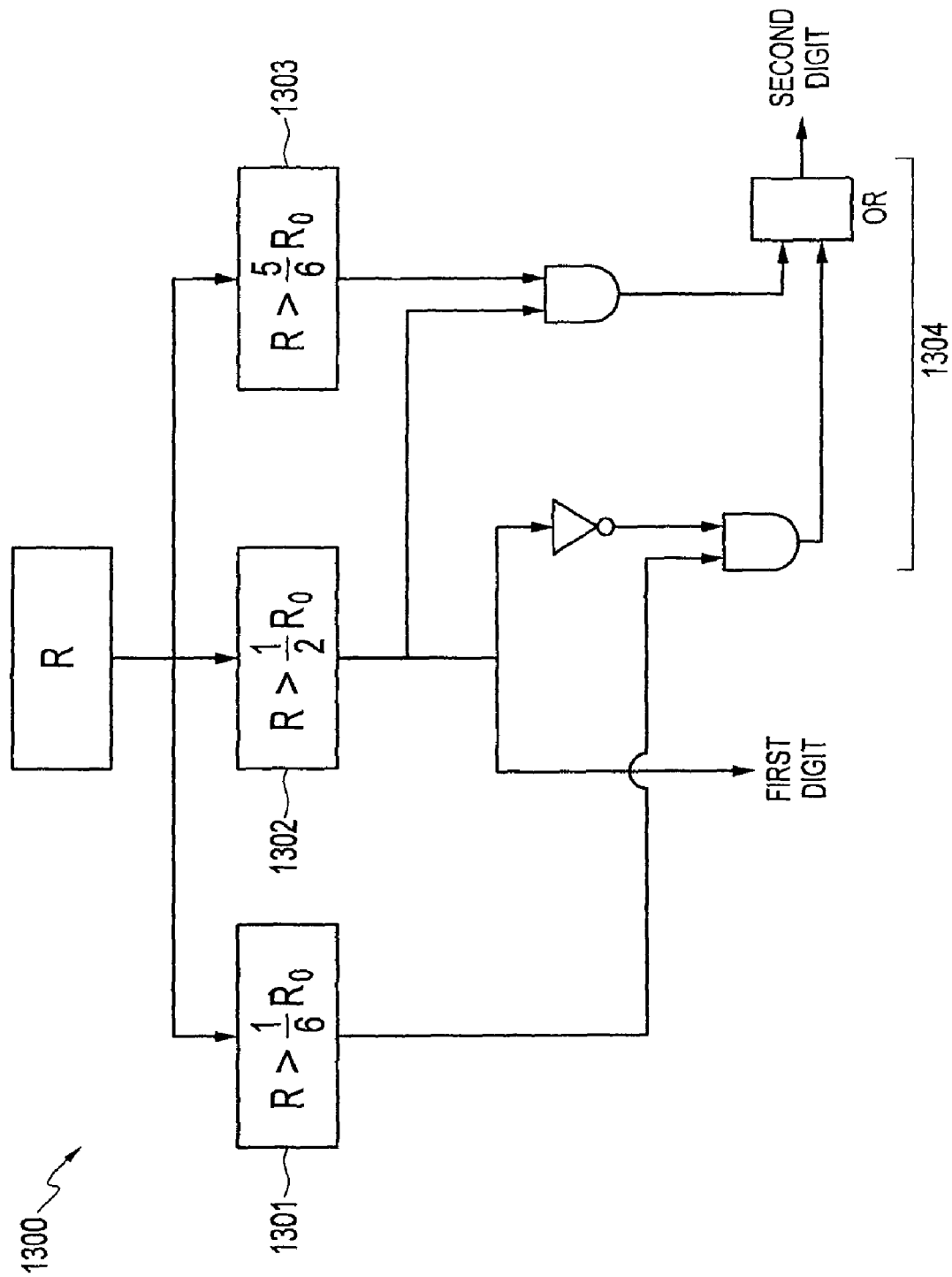
FIG. 13 depicts a four-state, current-sensing sense amplifier, which could be used in conjunction with the multi-state phase change memory cell embodiments disclosed herein.

Memory devices with multi-state phase change memory cells, such as the embodiments disclosed herein, must also comprise multi-state sense amplifiers in their readout circuitry. For example, memory devices with four-state phase change memory cells, such as those depicted in FIGS. 5A and 5B, require four-state sense amplifiers. FIGS. 12 and 13 depict two possible sensing schemes for sensing the resistances of four-state phase change memory cells. Of course, other embodiments and configurations are possible, including those capable of determining more than four states as is known by those skilled in the art.

FIG. 12 depicts a four-state, voltage-sensing scheme for a sense amplifier 1200, which could be used in conjunction with the multi-state phase change memory cell embodiments disclosed herein. The sense amplifier 1200 obtains the first bit of the two-bit result by applying a fixed read current and determining whether a readout voltage corresponding to cell resistance R is greater than $\frac{1}{2}$ of the readout voltage corresponding to a reference resistance $R_0$. If $R>\frac{1}{2}R_0$ then the first bit is 1. Otherwise, the first bit is 0. If the first bit is 0, the sense amplifier obtains the second bit by determining whether the readout voltage corresponding to resistance R is greater than $\frac{1}{6}$ of the readout voltage corresponding to the reference resistance $R_0$. If $R>\frac{1}{6}R_0$ then the second bit is 1. Otherwise, the second bit is 0. If the first bit is 1, the sense amplifier then obtains the second bit by determining whether the readout-voltage corresponding to cell resistance R is greater than $\frac{5}{6}$ of the readout voltage corresponding to the reference resistance $R_0$. If $R>\frac{5}{6}R_0$ then the second bit is 1. Otherwise, the second bit is 0. Thus, according to one embodiment, a readout voltage corresponding to R=0 yields 00, a readout voltage corresponding to R=$\frac{1}{3}R_0$ yields 01, a readout voltage corresponding to R=$\frac{2}{3}R_0$ yields 10, and a readout voltage corresponding to R=$R_0$ yields 11.

FIG. 13 depicts a four-state, current-sensing scheme for a sense amplifier 1300, which could be used in conjunction with the multi-state phase change memory cell embodiments disclosed herein. As shown, when a fixed read voltage is applied, three current sensing comparators 1301, 1302, 1303 compare a readout current corresponding to cell resistance R to reference currents corresponding to reference resistances $\frac{1}{6}R_0$, $\frac{1}{2}R_0$, and $\frac{5}{6}R_0$, respectively. The first bit of the two-bit result is the output of current sensing comparator 1302. Thus, if the readout current corresponding to cell resistance R is smaller than the readout current corresponding to $\frac{1}{2}R_0$, then the first bit is 1. Otherwise, the first bit is 0. The second bit of the two-bit result is obtained by passing the output of the three current sensing comparators 1301, 1302, 1303 through logic gates 1304, as shown. Thus, according to one embodiment, a readout current corresponding to R=0 yields 00, a readout current corresponding to R=$\frac{1}{3}R_0$ yields 01, a readout current corresponding to R=$\frac{2}{3}R_0$ yields 10, and a readout current corresponding to R=$R_0$ yields 11.

Multi-state phase change memory cells, including the disclosed embodiments described herein, may be fabricated as part of a memory device integrated circuit having one or more arrays of memory cells constructed in accordance with embodiments described herein. The corresponding integrated circuits may be utilized in a typical processor system. For example, FIG. 14 illustrates a typical processor system 1400 that includes a memory device 1403 employing improved phase change memory cells in accordance with the embodiments described herein. A processor system, such as a computer system, generally comprises a central processing unit (CPU) 1401, such as a microprocessor, a digital signal processor, or other programmable digital logic devices, which communicates with one or more input/output (I/O) devices 1404 over a bus 1405. The memory device 1403 communicates with the CPU 1401 over bus 1405 typically through a memory controller.

In the case of a computer system, the processor system 1400 may include peripheral devices such as removable media devices 1402 (e.g., CD-ROM drive or DVD drive) which communicate with CPU 1401 over the bus 1405. Memory device 1403 is preferably constructed as an integrated circuit, which includes one or more arrays of phase change memory devices. If desired, the memory device 1403 may be combined with the processor, for example CPU 1401, as a single integrated circuit.

The phase change memory cells disclosed herein can be formed using conventional deposition, implantation, and etching techniques well known in the art. Additionally, and also as well known in the art, the phase change elements are typically bordered by dielectric material on the sides not in contact with electrodes. It should also be appreciated that various embodiments have been described as using a phase change material as an exemplary variable resistance material. Embodiments of the invention may also be formed with other types of variable resistance material.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A processing system, comprising:
   a processor; and
   a resistive memory coupled to the processor, said resistive memory comprising:
      first and second electrodes; and
      a plurality of phase change elements arranged between said first and second electrodes, said phase change elements having different programming characteristics such that at a first programming voltage all phase change elements are in a high resistance state, at a second programming voltage all phase change elements are in a low resistance state, and at other programming voltages some of said phase change elements are in a high resistance state while others are in a low resistance state.

2. The processing system of claim 1, wherein the plurality of phase change elements comprises two phase change elements.

3. The processing system of claim 1, wherein the plurality of phase change elements comprises three or more phase change elements.

4. The processing system of claim 1, wherein each of the plurality of phase change elements has a different length.

5. The processing system of claim 1, wherein each of the plurality of phase change elements has approximately the same resistivity and length but different respective crystallization temperatures, melting points, and cross-sectional areas.

6. The processing system of claim 1, wherein each of the plurality of phase change elements has approximately the same crystallization temperature, melting point, cross-sectional area, and length but different respective resistivity.

7. The processing system of claim 1, wherein each of the plurality of phase change elements has approximately the same cross-sectional area and length but different respective crystallization temperatures, melting points, and resistivities.

8. The processing system of claim 1, wherein said plurality of phase change elements are arranged between a single first electrode and a single second electrode.

9. A method of fabricating a resistive memory cell, the method comprising:
   forming a first electrode;
   forming a plurality of phase change resistance elements in contact with said first electrode, each of said resistance elements having a respective resistance curve as a function of programming voltage which is shifted relative to the resistance curves of others of said resistance elements; and
   forming a second electrode in contact with the plurality of phase change elements.

10. The method of claim 9, wherein at least one of the plurality of phase change resistance elements is doped with a dopant.

11. The method of claim 10, wherein the dopant is at least one of O, N, and Si.

12. The method of claim 9, wherein the plurality of resistance elements are formed before the second electrode.

13. The method of claim 9, wherein forming the plurality of phase change resistance elements comprises depositing a layer of phase change material, selectively etching the layer of phase change material to form the plurality of phase change resistance elements, and depositing a dielectric between each of said plurality of phase change resistance elements.

14. The method of claim 13, further comprising doping at least one of the plurality of phase change elements after the etching step.

15. The method of claim 9, wherein each of the plurality of phase change elements has a different length.

16. The method of claim 9, wherein the plurality of phase change elements comprises two elements.

17. The method of claim 9, wherein the plurality of phase change elements comprises three or more elements.

18. The method of claim 9, wherein said plurality of phase change elements are in contact with a single first electrode and a single second electrode.

* * * * *

UNITED STATES PATENT AND TRADEMARK OFFICE
CERTIFICATE OF CORRECTION

PATENT NO. : 7,952,919 B2
APPLICATION NO. : 12/949844
DATED : May 31, 2011
INVENTOR(S) : Jun Liu et al.

It is certified that error appears in the above-identified patent and that said Letters Patent is hereby corrected as shown below:

On the Title page, in Item (57), under "Abstract", in column 2, line 3, delete "phrase" and insert -- phase --, therefor.

Signed and Sealed this
Nineteenth Day of July, 2011

David J. Kappos
*Director of the United States Patent and Trademark Office*